(12) United States Patent
Greve

(10) Patent No.: US 11,088,462 B2
(45) Date of Patent: Aug. 10, 2021

(54) QUICK-CHANGE CIRCULARLY POLARIZED ANTENNA FITMENT

(71) Applicant: Charles A. Greve, Amherst, VA (US)

(72) Inventor: Charles A. Greve, Amherst, VA (US)

(73) Assignee: VIDEO AERIAL SYSTEMS, LLC, Madison Heights, VT (US)

( * ) Notice: Subject to any disclaimer, the term of this patent is extended or adjusted under 35 U.S.C. 154(b) by 0 days.

(21) Appl. No.: 15/922,834

(22) Filed: Mar. 15, 2018

(65) Prior Publication Data

US 2020/0243982 A1 Jul. 30, 2020

(51) Int. Cl.
*H05K 1/02* (2006.01)
*H01Q 1/42* (2006.01)
*H01Q 9/18* (2006.01)
*H01Q 15/24* (2006.01)

(52) U.S. Cl.
CPC ............. *H01Q 15/244* (2013.01); *H01Q 1/42* (2013.01); *H01Q 9/18* (2013.01); *H05K 1/0213* (2013.01)

(58) Field of Classification Search
CPC ........... H01Q 1/085; H01Q 9/22; H01Q 9/30; H01Q 19/28; H01Q 1/422; H01Q 15/244; H01Q 9/18; H01Q 5/378; H05K 1/0213
See application file for complete search history.

(56) References Cited

U.S. PATENT DOCUMENTS

| | | | |
|---|---|---|---|
| 6,876,337 B2 * | 4/2005 | Larry | H01Q 11/08 343/818 |
| 9,484,628 B2 * | 11/2016 | Petros | H01Q 1/362 |
| 10,608,346 B2 * | 3/2020 | Greve | H01Q 15/244 |
| 2017/0346194 A1 * | 11/2017 | Chamberland | H01Q 21/205 |

FOREIGN PATENT DOCUMENTS

KR    20080034642 A   *   4/2008  ............. H01Q 13/24

* cited by examiner

*Primary Examiner* — Ricardo I Magallanes
(74) *Attorney, Agent, or Firm* — Rupak Nag

(57) ABSTRACT

Provided are examples of removable circularly polarized antenna fitment and methods of fabrication. In one aspect, a fitment comprises a plurality of conductive elements spaced radially around a central point contained with a housing. The elements may have an included angle of between 8 and 71 degrees from horizontal. The plurality of conducting elements may be straight, bent, or curved and may be comprised of between 3 and 12 conductors. The fitment may contain a housing which is removable from a linear antenna.

8 Claims, 11 Drawing Sheets

QUICK-CHANGE CIRCULARLY POLARIZED ANTENNA FITMENT

TECHNICAL FIELD

The present disclosure relates generally to antenna systems, and more specifically to circularly polarized omni-directional antennas for various uses.

BACKGROUND

Circularly polarized antennas have a multitude of advantages in data transfer, WiFi, and drone vehicles by limiting the effect of multipath interference. This results in higher signal clarity and higher data transfer rate with fewer errors. In addition, circularly polarized antennas do not suffer polarization loss when communicating with antennas that are not in the same orientation (e.g., vertical).

Most antennas supplied with WiFi or wireless video equipment are basic linearly polarized sleeved dipoles often called "whips" or "rubber duckies" for their appearance and relatively flexible structure. While simple and convenient, these antennas are linearly polarized which limits their capability in sending data and information. What is needed is an antenna fitment that can be installed on a simple linearly polarized antenna to convert it to a circularly polarized antenna.

SUMMARY

Provided are example embodiments of a quick-change circularly polarized antenna fitment for a Right-Hand Circularly Polarized antenna system and methods of fabricating such devices.

In one aspect, which may include at least a portion of the subject matter of any of the preceding and/or following examples and aspects, a quick-change circularly polarized antenna fitment comprises a plurality of conductive elements of similar length and angle spaced radially around a central location. The number of individual conductors in the plurality of conductive elements may be between 3 and 12 conductors. The plurality of conductive elements may be straight, bent, or curved depending on the desired performance and size of the structure. The angle and shape of the conductive elements will vary depending on their respective distance from the center of the fitment. The conductive elements in the plurality of conductive elements may be a PCB trace or a conductive wire. The signal rotation direction may be changed from RHCP to LHCP by changing the direction of the elements within the plurality of conductive elements.

The quick-change circularly polarized antenna fitment further comprises a housing which supports the plurality of conductive elements. This housing may be round, triangular, square, pentagonal, hexagonal or similar shape depending on the structure of the plurality of parasitic elements and the antenna structure to which it will be fitted and the desired appeal of the device.

The individual elements in the plurality of conductive elements may have an average included angle of between 8 and 71 degrees from horizontal. The elements within the plurality of conductive elements may be bent or curved within the structure. For example, each element in the plurality of conductive elements may be a PCB trace angled at 35 degrees from horizontal curved inside of a circular housing.

In other embodiments, the elements within the plurality of parasitic elements may be bent to change angle within the cover. For example, a parasitic element may be tilted at an angle of 30 degrees in the center, but then flatten to an angle of 0 degrees when turning a corner within the housing forming a "U" shape.

The lengths of the elements in the plurality of conductive elements will vary with the type of element and the structure of the housing as well as the desired operation frequency. The distances and angles of the elements in the plurality of conductive elements will vary depending on size and desired performance of the quick-change circularly polarized antenna fitment.

Embodiments of the invention include corresponding devices, systems and, methods. For instance, a system is provided comprising a sleeved dipole or "whip" linearly polarized antenna by which the quick-change antenna fitment slides over. However, many other antenna types may be used such as a side feed dipole (also call a "T-style dipole"), a J-pole, or a Franklin antenna.

In another aspect of the present invention, a method for constructing a quick-change circularly polarized antenna fitment is provided. A PCB containing the plurality of conducting elements is inserted into a cylindrical housing. A base cap is fitted to the bottom opening of the housing creating an enclosed housing for the plurality of conductive elements.

DETAILED DESCRIPTION OF EXAMPLE EMBODIMENTS

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a plurality of conducting elements may be two or more sets of elements set at different distances and angles from the center of the housing.

Various embodiments are provided which describe a circularly polarized omni-directional antenna fitment. Such antenna fitments may have implementations in a variety of fields, including, but not limited to video piloting, drone vehicles (aircraft and ground, mesh networking, and Wi-Fi applications. In various embodiments, the antenna uses a plurality of conductive elements extending radially outward above a reflector. The plurality of conductive elements may contain between 3 and 12 conductors. Such conducting elements may be wire type, printed circuit board (PCB), or a combination of both. Accordingly, various embodiments described in the present disclosure provide a lightweight inexpensive omni-directional antenna fitment that includes reduced sizing with greater bandwidth and performance that may be implemented in a variety of systems.

Figure 1:
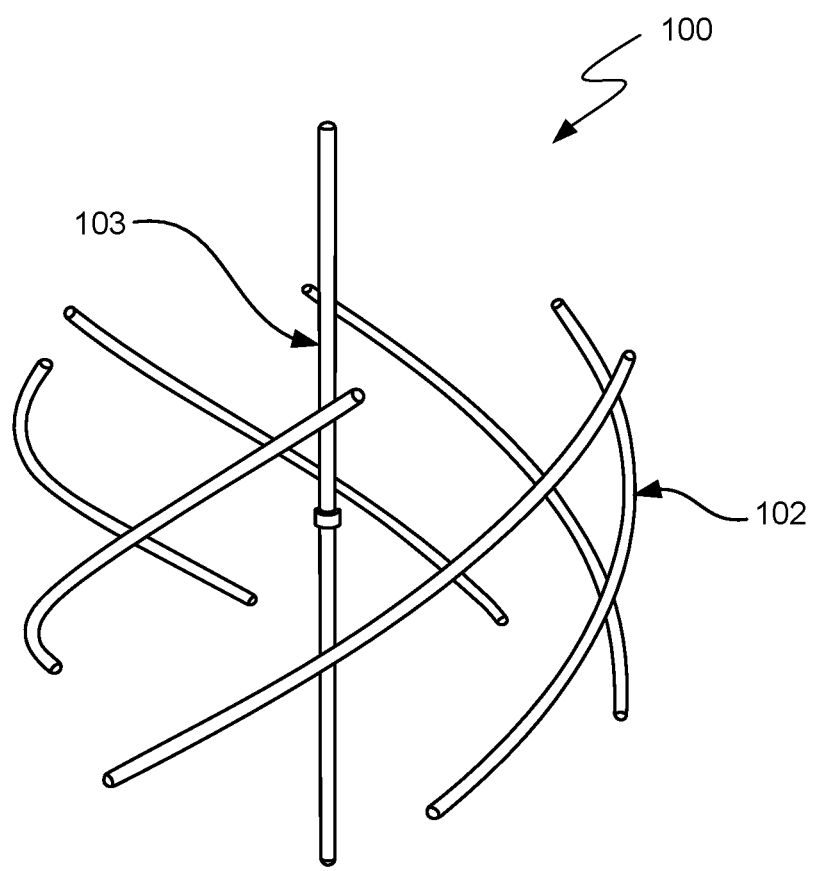
FIG. 1 is a perspective view of curved elements in the plurality of conductive elements in accordance with one or more embodiments.
Figure 6:
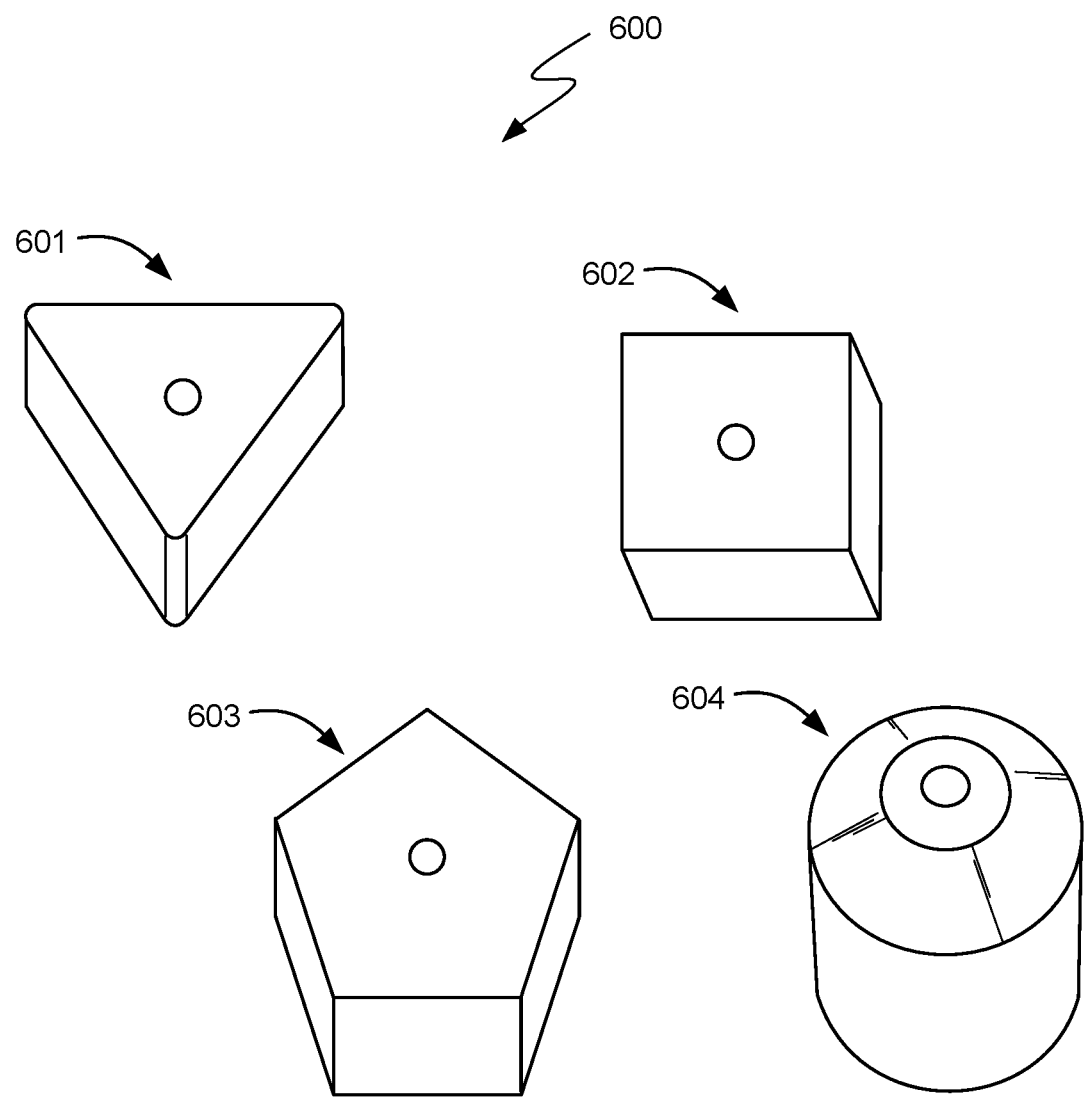
FIG. 6 illustrates example housing styles for a quick-change circularly polarized antenna fitment for a sleeved dipole in accordance with one or more embodiments.

With reference to FIG. 1, shown is a perspective view of an example curved conductor system 100 within the plurality of conductive elements for a quick-change antenna fitment. Each element 102 is positioned radially approximately the same distance from the central feed 103. Each element 102 is curved to fit inside of a round cover 604 as shown in FIG. 6.

Figure 2:
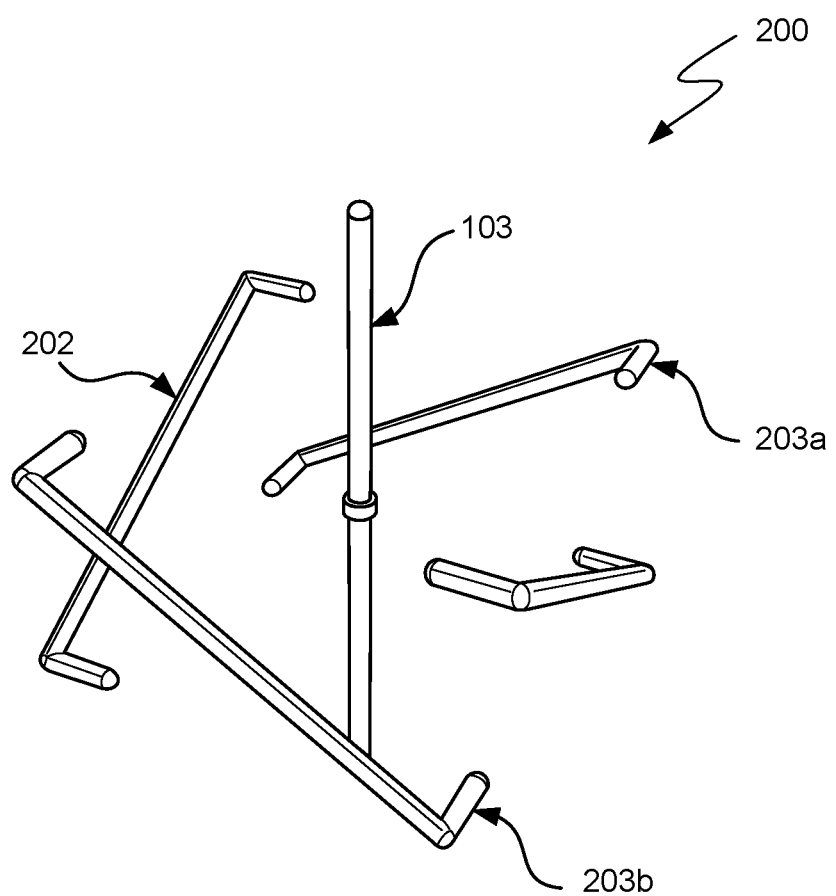
FIG. 2 is a perspective view of bend or "U" shaped elements in the plurality of conductive elements in accordance with one or more embodiments.

With reference to FIG. 2, shown is a perspective view of an example conductor system of "U" shaped elements 200 within the plurality of conductive elements for a quick-change antenna fitment. Each element 202 is positioned approximately the same from the central feed 103. The element tips 203a and 203b are turned in to create a compact square form quick-change antenna fitment 602 as shown in FIG. 6.

Figure 3:
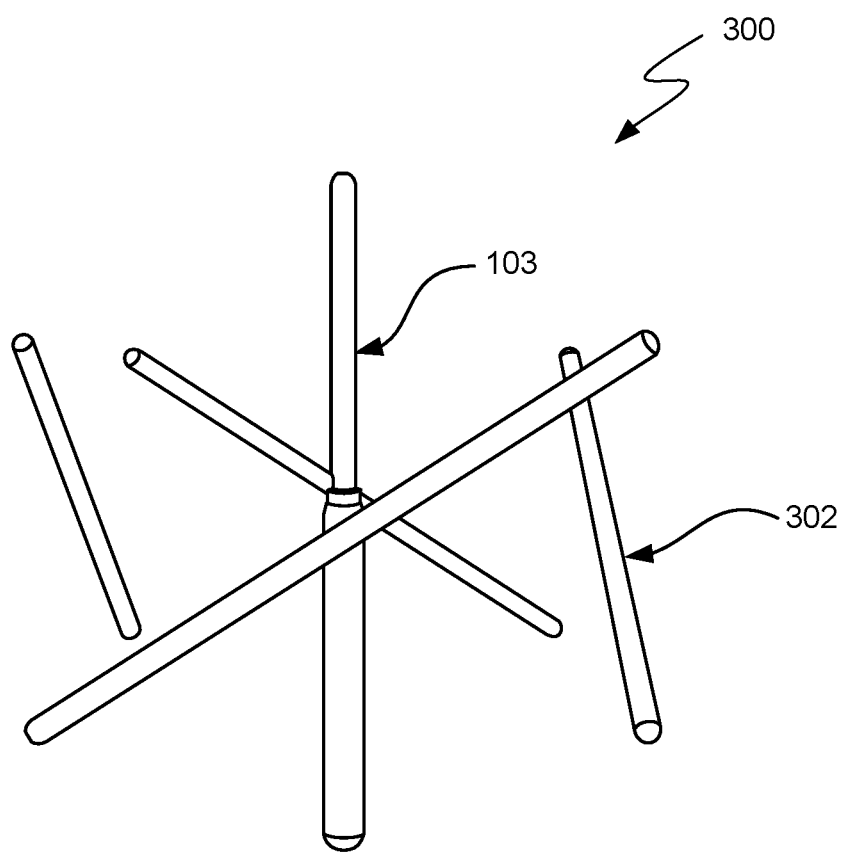
FIG. 3 is a perspective view of straight elements in the plurality of conductive elements in accordance with one or more embodiments.

With reference to FIG. 3, shown is a perspective view of an example conductor system of straight elements 300 within the plurality of conductive elements for a quick-change antenna fitment. Each element, such as element 302, is positioned approximately the same distance from the central feed 103.

Figure 4A:
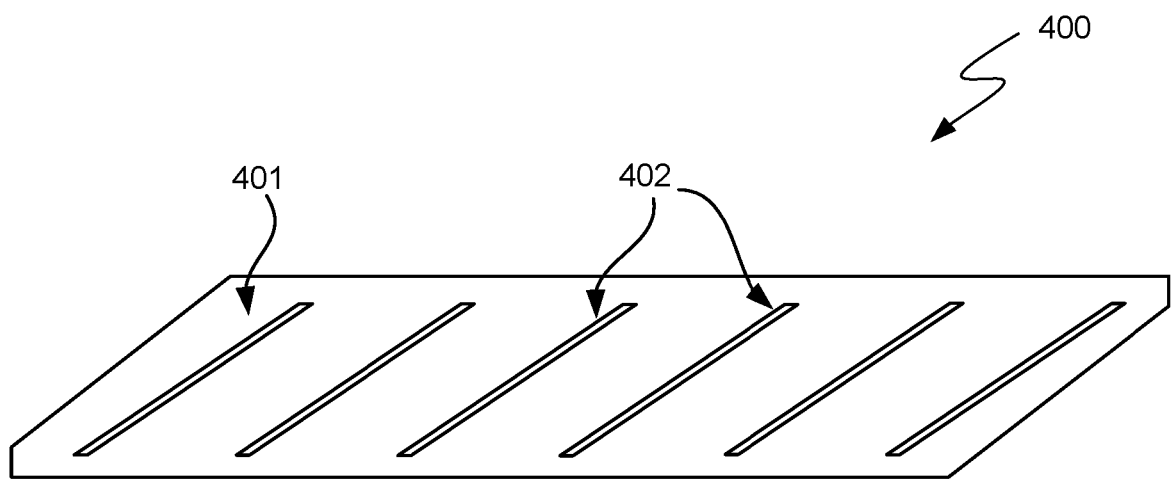
FIGS. 4A and 4B are perspective views of an example element systems in the plurality of conductive elements embedded in a PCB.

With reference to FIG. 4A shown is a perspective view of an example element system 400 for a round quick-change antenna fitment embedded in a PCB. The PCB 401 may be a flexible PCB or a thin fiberglass material such as FR4 or 370HR. The conductive elements 402 are conductive traces within the PCB. The conductive traces 402 may be any conductive material including copper, silver, gold, or a combination of materials. The angle of each conductive element 402 may be anywhere from 8 to 71 degrees from horizontal.

Figure 4B:
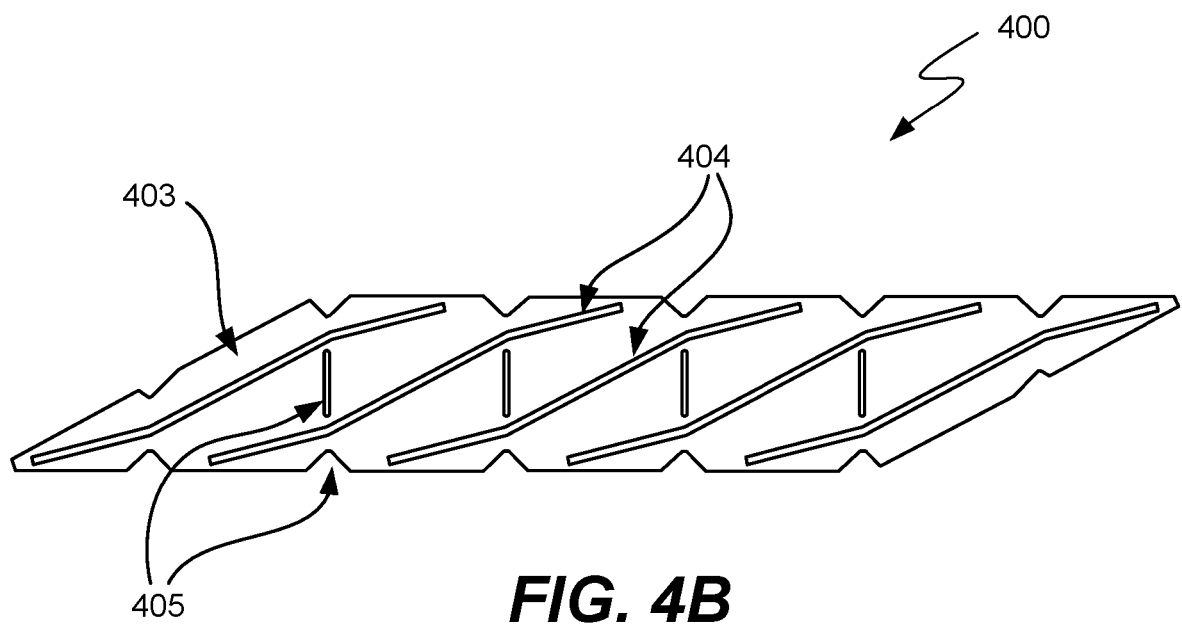

With reference to FIG. 4B, shown is a perspective view of an example PCB element system 400 for a pentagonal quick-change antenna fitment. The PCB 403 may be made of a rigid material such as FR4 or 370 HR or may be made of a flexible material. The conductive elements 404 may be made of any conductive material including copper, silver, gold or a combination of conductive materials. The conductive elements 404 may change angles at various points or may maintain a consistent angle. The average angle of the conductive elements 404 may be between 8 and 71 degrees from horizontal. Strain relief notches 405 may be cut in the PCB 403 to allow it to bend around corners or angles within a cover.

Figure 5A:
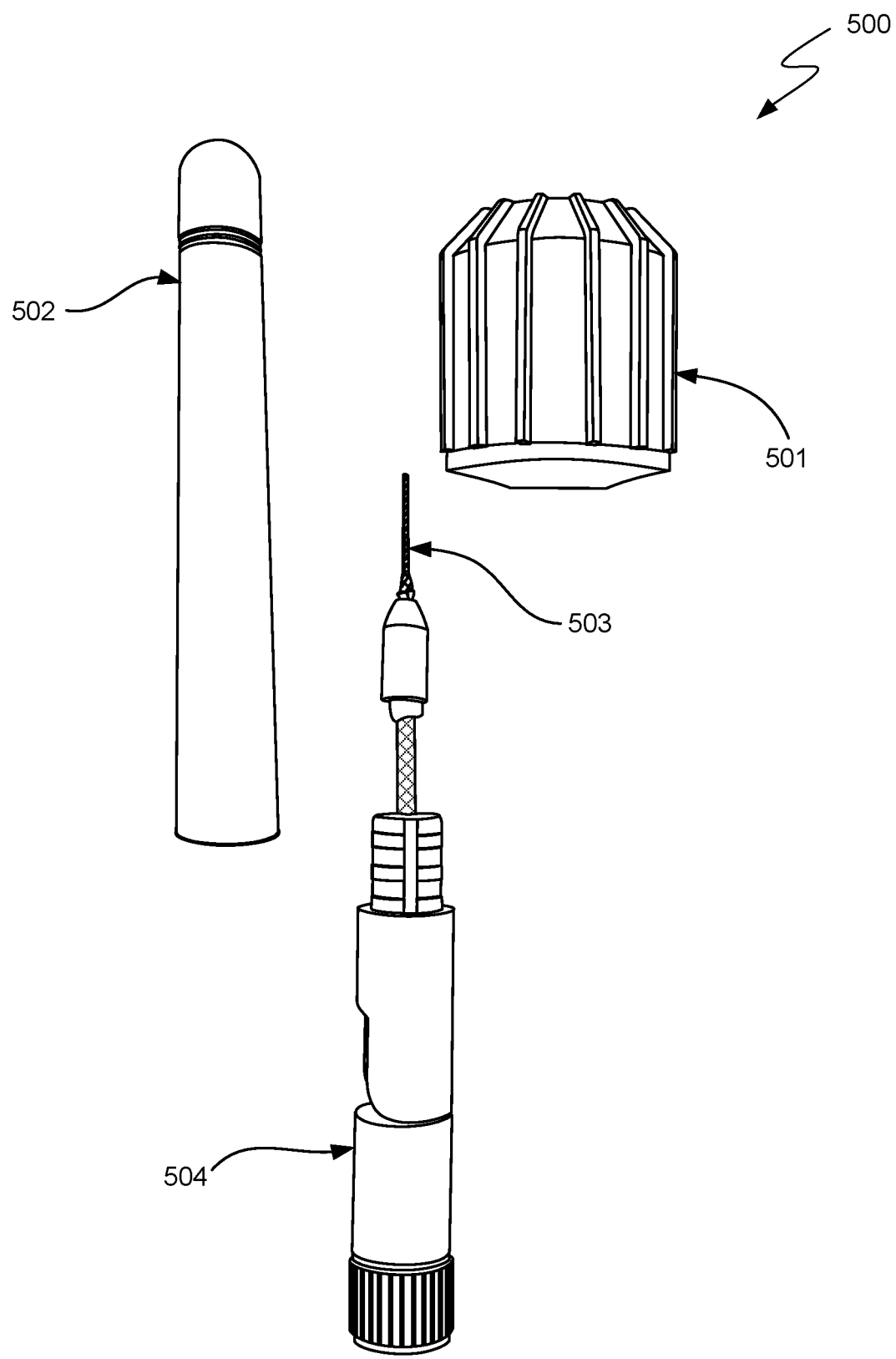
FIGS. 5A, 5B, 5C, and 5D illustrate a perspective view of an example assembly and housing for a quick-change circularly polarized antenna fitment for a sleeved dipole in accordance with one or more embodiments.

With reference to FIG. 5A, shown is a perspective view of a quick-change circularly polarized antenna fitment system 500 for a sleeved dipole. A sleeved dipole 503 contains a base 504 and a covering 502. The covering 502 slides over the base 504 to house and protect the sleeved dipole 503. The quick-change antenna case 501 is designed such that it will slide over the sleeved dipole covering 502.

Figure 5B:
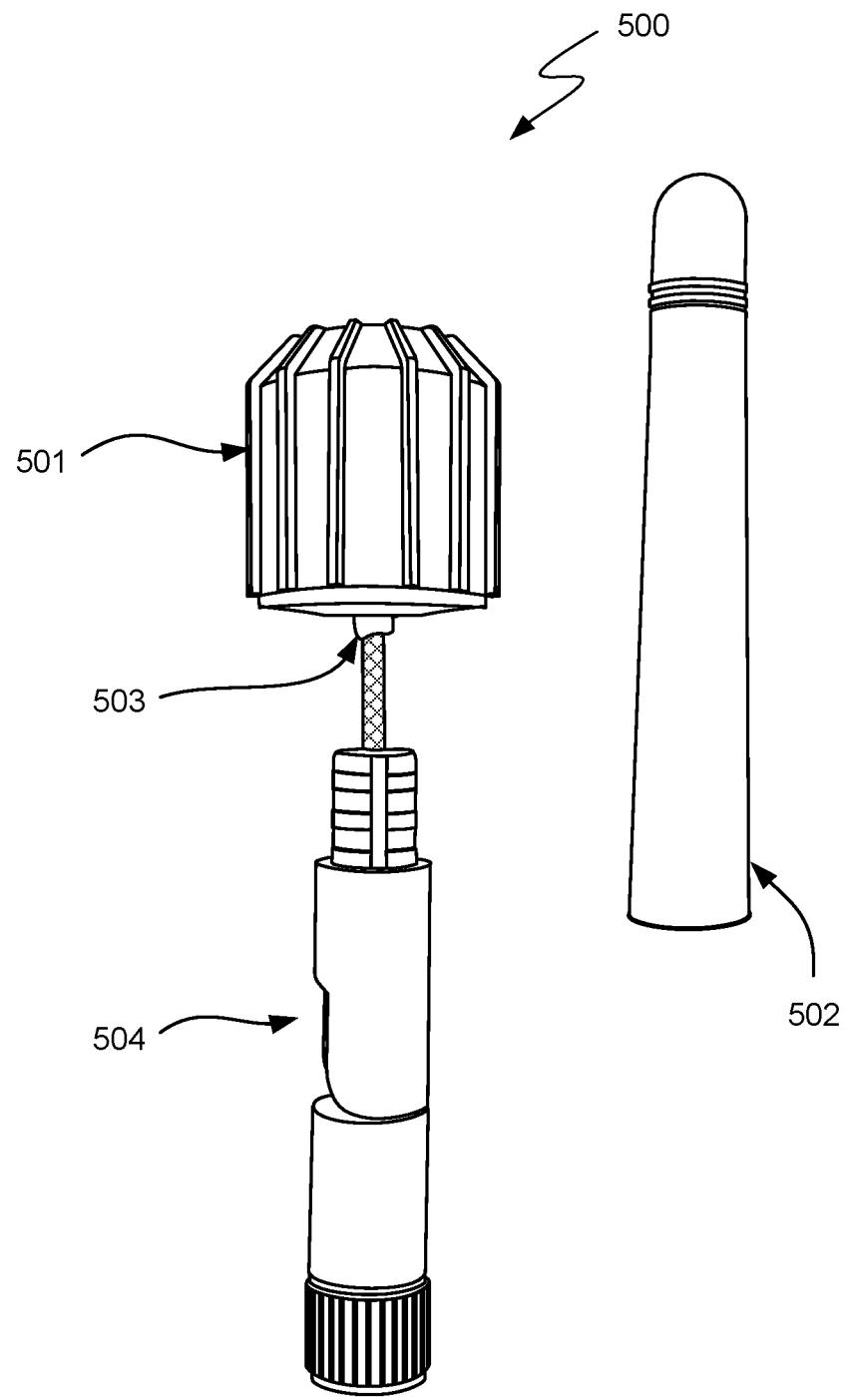

With reference to FIG. 5B shown is a perspective view of a quick-change circularly polarized antenna fitment system 500 for a sleeved dipole with the sleeved dipole's covering 502 removed. The quick-change antenna case 501 is positioned over the sleeved dipole 503 such that the quick change antenna case 501 surrounds a portion or all of the sleeved dipole 503.

Figure 5C:
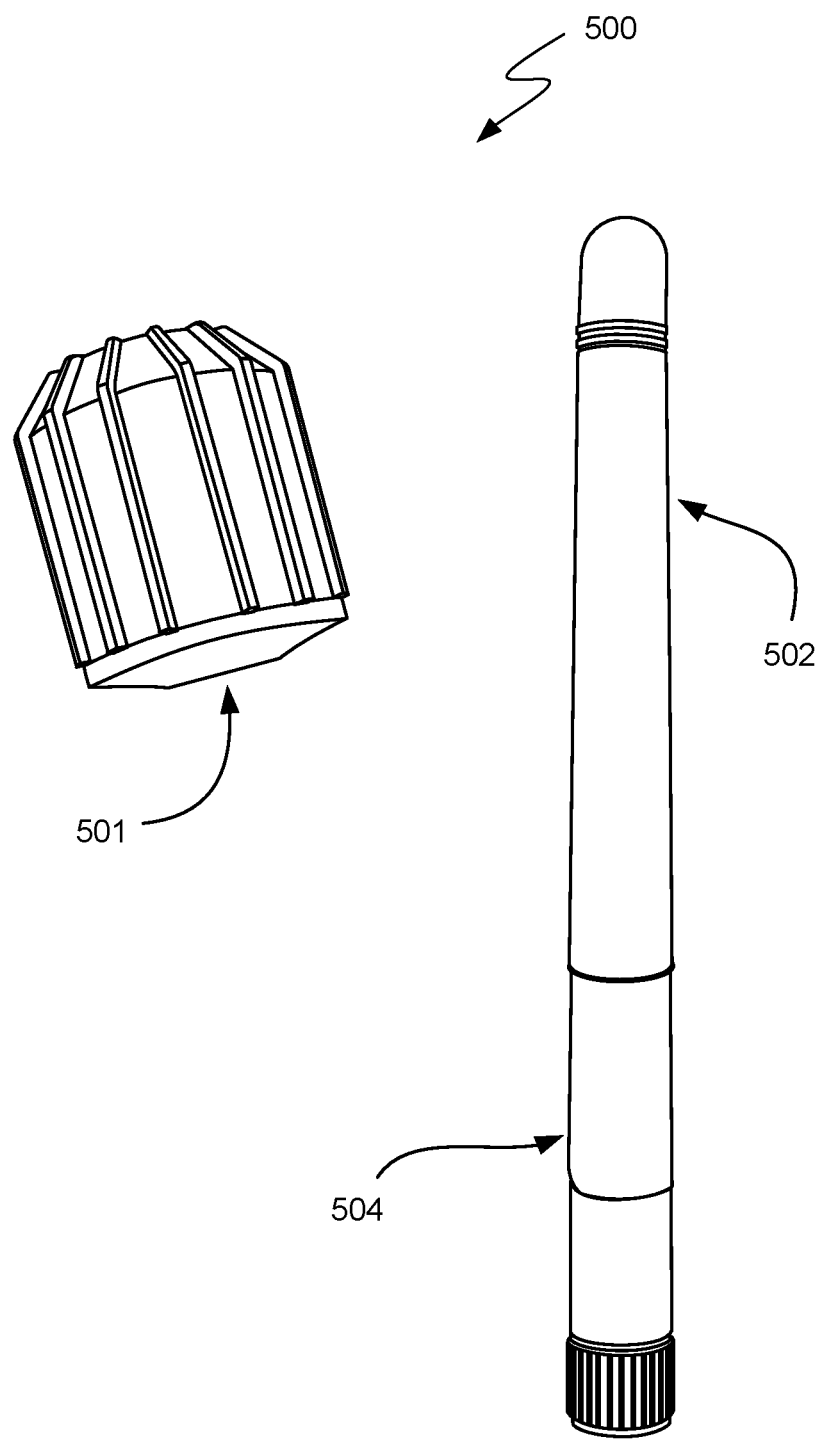

With reference to FIG. 5C shown is a perspective view of a quick-change circularly polarized antenna fitment system 500 for a sleeved dipole with the quick-change antenna case 501 separated from the sleeved dipole covering 502. The sleeved dipole 503 rests inside the covering 502. The quick-change antenna case 501 may slide over the sleeved dipole covering 502.

Figure 5D:
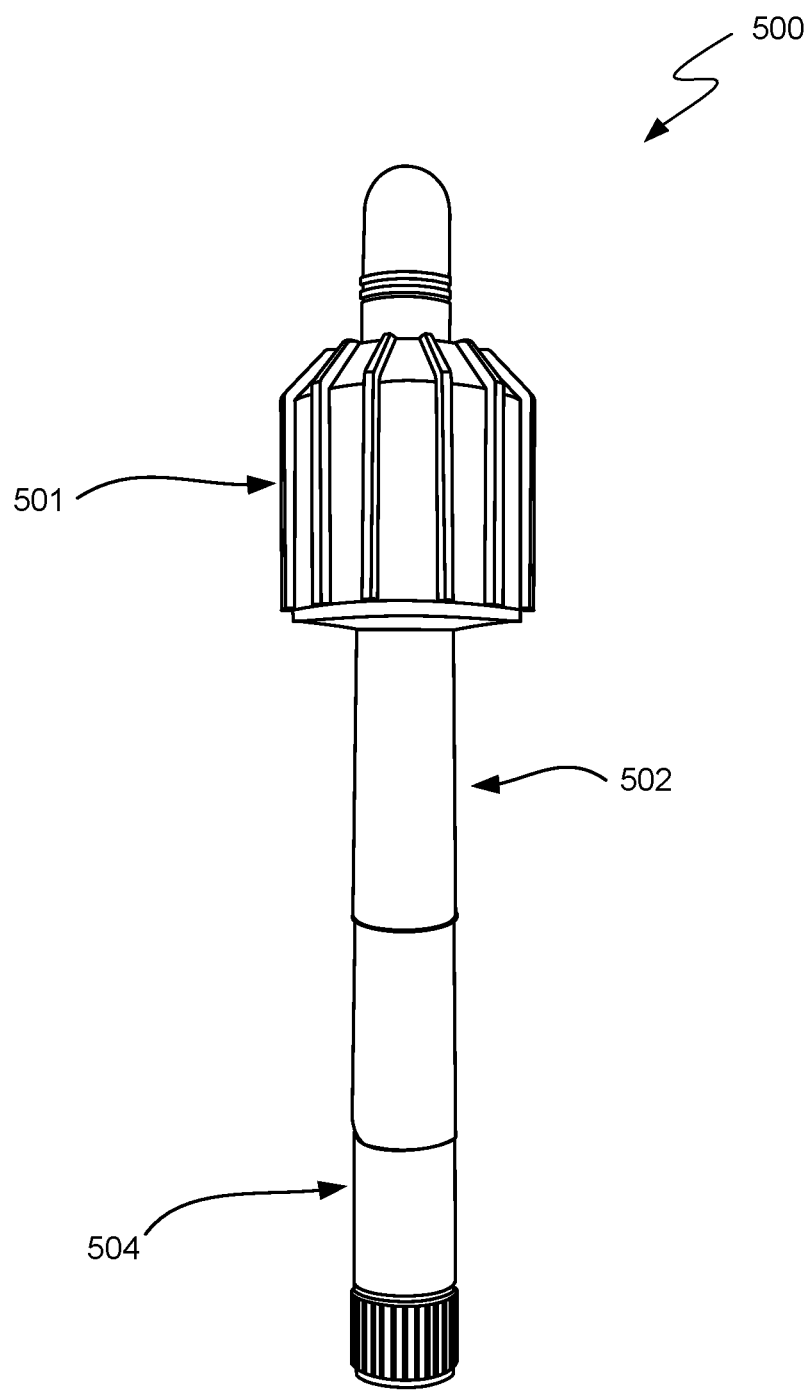

With reference to FIG. 5D shown is a perspective view of a quick-change circularly polarized antenna fitment system 500 fully assembled on a sleeved dipole antenna. The quick-change antenna case 501 slides overtop of the sleeved dipole covering 502 such that it surrounds the sleeved dipole 503.

With reference to FIG. 6, shown are perspective views of alternate housings 600 for a quick-change antenna system. A triangular housing 601 may contain 3 straight or U-shaped conductive elements. A square housing 602 may contain 4 straight or U-shaped conductive elements. A pentagonal housing 603 may contain 5 straight or U-shaped conductive elements. A circular housing 604 may contain between 3 and 12 curved conductive elements. While examples of housings are given, it is not the intent to limit the scope of this invention, hexagonal, pentagonal, octagonal, and others are potential coverings not shown in FIG. 6.

Figure 7A:
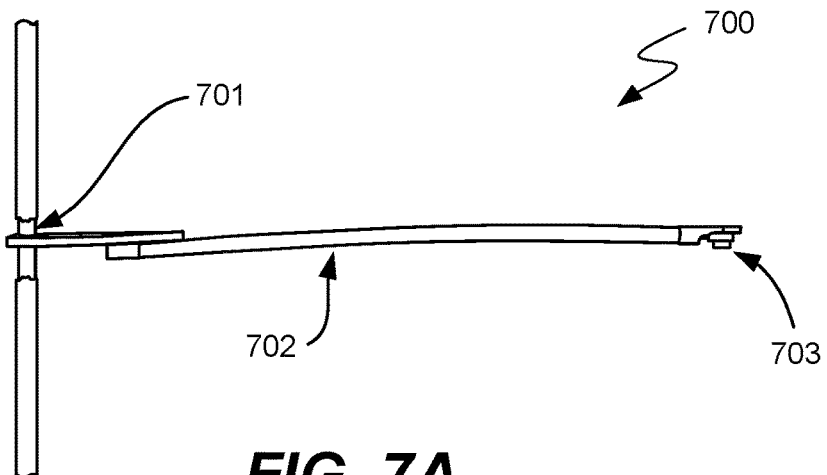
FIGS. 7A, 7B, and 7C illustrate a perspective view of an example housing for a quick-change circularly polarized antenna fitment for a Side feed or "T-style" dipole in accordance with one or more embodiments.
Figure 7B:
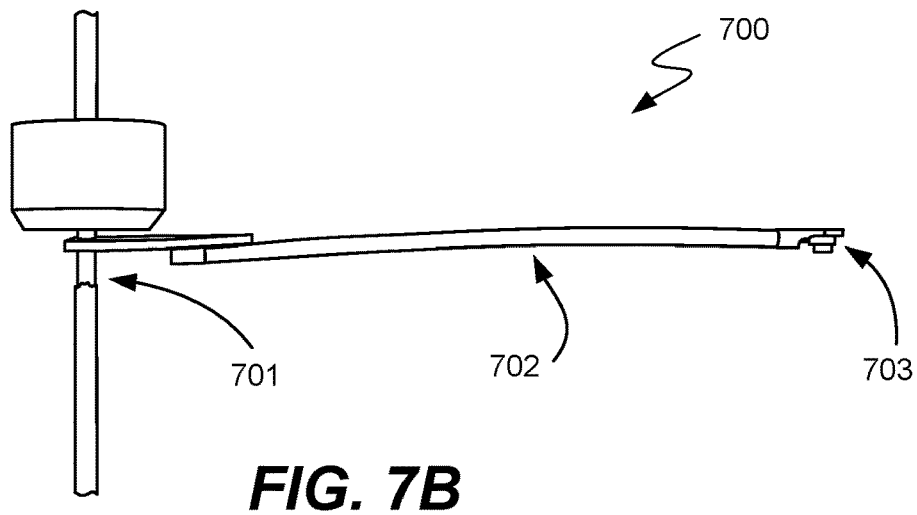
Figure 7C:
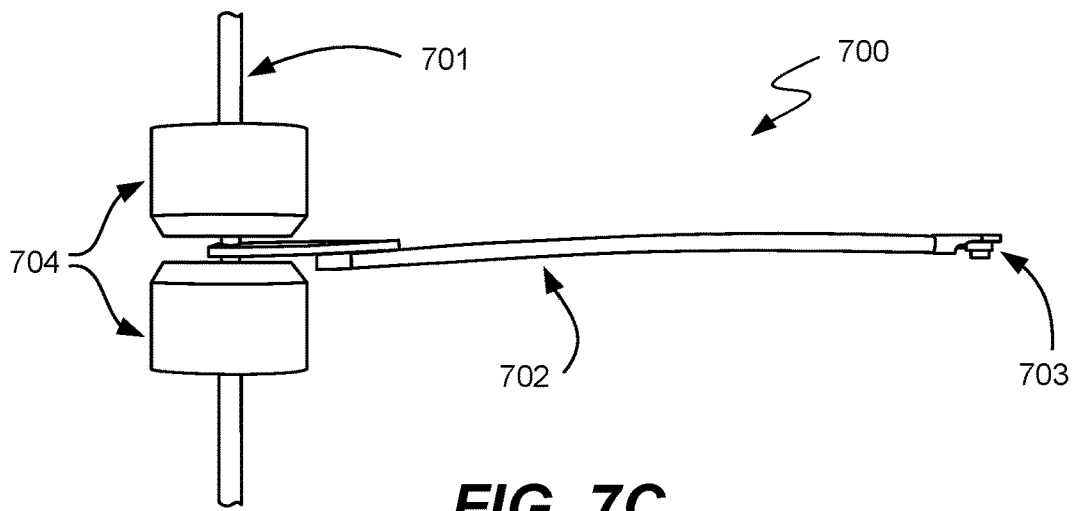

With reference to FIGS. 7A, 7B, and 7C, shown are examples of housings for a quick-change circularly polarized antenna fitment 700 for a Side feed or "T-style" dipole 701. A T-style dipole 701 may include a feedline 702. This feedline 702 may be a coaxial cable such as RG178. The feedline may be any transmission line of suitable characteristics. The feedline 702 may be directly connected to a transmitter or receiver or may be connected to an RF connector 703. Such RF connector 703 may be a u.fl connector or MMCX connector. The RF connector may be any type of suitable connection for the chosen frequency. One or more quick-change antenna housings 704 may be placed over one or both elements in a T-style dipole 701. In another example, a center mount quick-change antenna housing may be used for T-style dipole 701. This housing may be made from any non-conductive material such as polycarbonate plastic.

Figure 8:
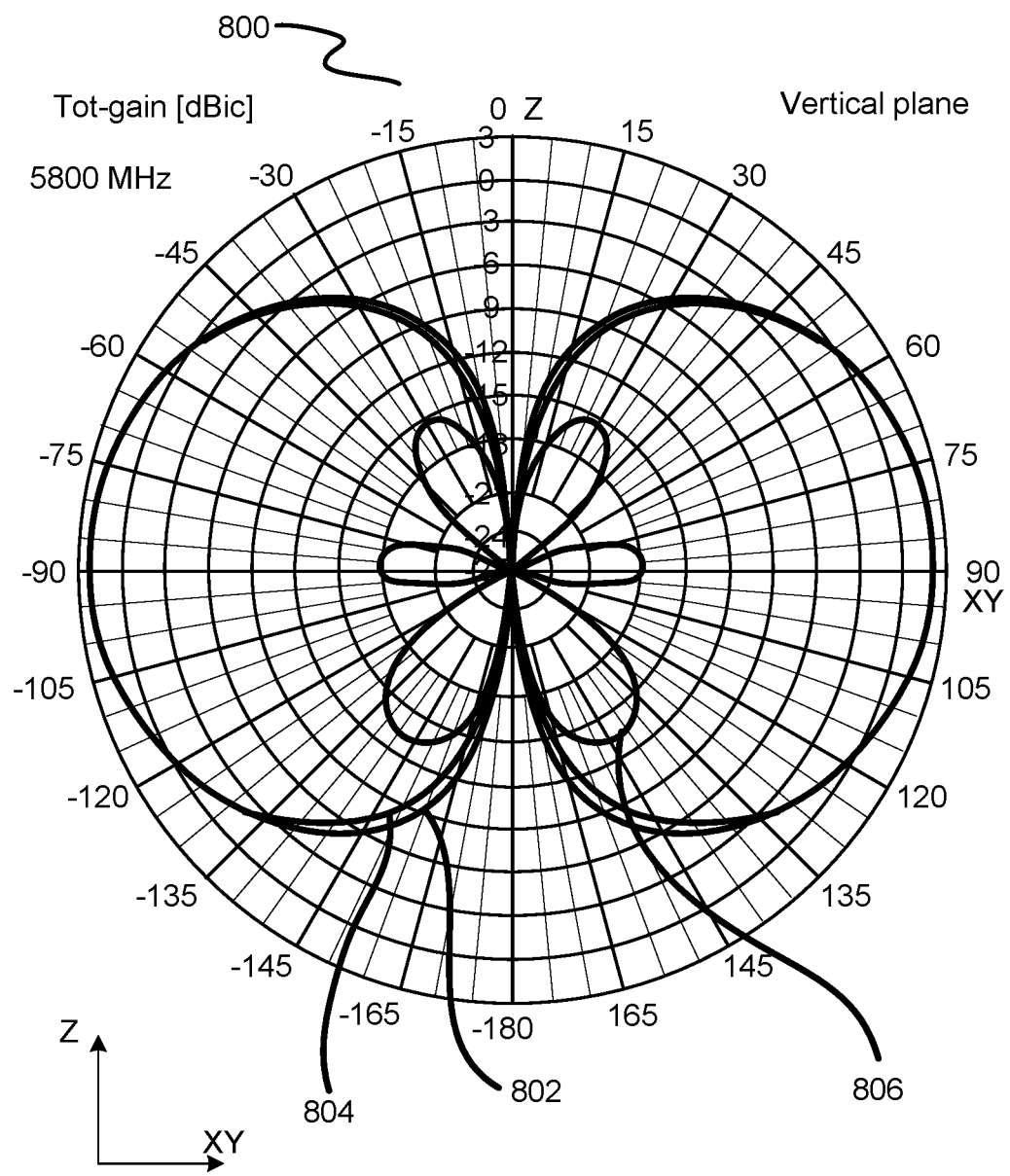
FIG. 8 is an example radiation pattern graph of an omni-directional circularly polarized antenna fitted with a quick-change circularly polarized antenna fitment, in accordance with one or more embodiments.

With reference to FIG. 8, shown is an example radiation pattern 800 for a quick-change antenna fitment on a sleeved dipole antenna in accordance with one or more embodiments. Total gain pattern 802 shows an example total gain of a dipole antenna with a quick change antenna fitment. It is the addition of dominant radiation pattern 804 and recessive radiation pattern 806. The dominant radiation pattern 804 and recessive pattern 806 may be reversed from RHCP to LHCP by reversing the direction of the elements 102 in FIG. 1 with the plurality of conductive elements.

What is claimed is:

1. A quick-change, removable antenna fitment comprising: a plurality of non-movable and non-adjustable conductive elements located radially around a central location and within a housing, wherein the conductive elements are straight individual wires; and the housing being made from a non-conductive material, wherein the plurality of conductive elements is located within the housing made from a rigid non-conductive material and wherein the housing is removable from a central antenna thereby enabling the quick-change, removable antenna fitment: and wherein the plurality of conductive elements is not electrically bonded to the central antenna.

2. The fitment of claim 1 where the conductive elements are embedded in a printed circuit board.

3. The fitment of claim 1 where the conductive elements within the plurality of conductive elements are bent to fit in the non-conductive housing.

4. The fitment of claim 1 wherein the non-conductive housing supports the plurality of conductive elements.

5. A quick-change, removable antenna fitment system comprising: an existing central linearly polarized antenna; a fitment including: a protective housing comprising a rigid non-conductive material; and a plurality of non-movable and non-adjustable conducting elements spaced radially around the center of the protective housing wherein a plurality of conductive elements is contained within said protective housing and wherein the protective housing is removable from a central antenna thereby enabling the quick-change, removable antenna fitment system; and wherein the plurality of conductive elements is straight individual wires, and not electrically bonded to the central antenna.

6. The system of claim 5, wherein the antenna fitment is coupled to an RF transmitter or receiver.

7. The system of claim 6, wherein each conductive element of the plurality conductive elements is arranged in a manner to receive or transmit a circularly polarized signal.

8. A method for constructing a quick-change, removable antenna fitment, the method comprising: installing a plurality of non-adjustable and non-movable conductive elements into a rigid support housing, wherein the conductive elements are straight individual wires; and securing the plurality of non-adjustable and non-movable conductive elements to an interior of the support housing; and enclosing the rigid support housing wherein the plurality of conductive elements is contained within the support housing, wherein the support housing is removable from a central antenna thereby enabling the quick-change, removable antenna fitment.

* * * * *